(12) United States Patent
Chung

(10) Patent No.: US 8,629,463 B2
(45) Date of Patent: Jan. 14, 2014

(54) ORGANIC LIGHT-EMITTING DISPLAY DEVICE

(75) Inventor: Jin-Koo Chung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 384 days.

(21) Appl. No.: 13/041,050

(22) Filed: Mar. 4, 2011

(65) Prior Publication Data

US 2011/0215329 A1 Sep. 8, 2011

(30) Foreign Application Priority Data

Mar. 5, 2010 (KR) ........................ 10-2010-0020060

(51) Int. Cl.
*H01L 33/00* (2010.01)
*H01L 35/24* (2006.01)
*H01L 29/04* (2006.01)

(52) U.S. Cl.
USPC ................ 257/88; 257/40; 257/59; 257/83; 257/E51.019

(58) Field of Classification Search
USPC .................... 257/88, 40, 59, 79, 83, E51.019; 313/505, 506, 498
See application file for complete search history.

(56) References Cited

U.S. PATENT DOCUMENTS

| | | | | |
|---|---|---|---|---|
| 6,900,470 B2 * | 5/2005 | Kobayashi et al. | ............ | 257/88 |
| 7,173,373 B2 | 2/2007 | Yamada et al. | | |
| 7,411,344 B2 * | 8/2008 | Yamazaki et al. | ............ | 313/506 |
| 2004/0160170 A1 * | 8/2004 | Sato et al. | ..................... | 313/504 |
| 2004/0257473 A1 * | 12/2004 | Miyagawa | ..................... | 348/571 |
| 2005/0236629 A1 | 10/2005 | Lee et al. | | |
| 2006/0060850 A1 | 3/2006 | Kwak et al. | | |
| 2006/0113900 A1 | 6/2006 | Oh | | |
| 2007/0066178 A1 | 3/2007 | Yamada et al. | | |
| 2009/0128023 A1 | 5/2009 | Kwak et al. | | |

FOREIGN PATENT DOCUMENTS

| | | |
|---|---|---|
| JP | 2006-128241 | 5/2006 |
| KR | 10-2004-0078304 A | 9/2004 |
| KR | 10-2005-0028803 A | 3/2005 |
| KR | 1020050098596 | 10/2005 |
| KR | 1020050113517 | 12/2005 |
| KR | 1020060059722 | 6/2006 |
| KR | 100875103 | 12/2008 |

OTHER PUBLICATIONS

Korean Notice of Allowance issued on Nov. 14, 2011 in connection with Korean Patent Application Serial No. 10-2010-0020060 and Request for Entry of the Accompanying Office Action attached herewith.

* cited by examiner

*Primary Examiner* — Shouxiang Hu
(74) *Attorney, Agent, or Firm* — Robert E. Bushnell, Esq.

(57) ABSTRACT

An organic light-emitting display device, formed to be transparent, includes a substrate; a plurality of thin film transistors disposed on the substrate; a passivation layer covering the plurality of thin film transistors; a plurality of pixel electrodes disposed on the passivation layer and connected electrically to the plurality of thin film transistors, and overlapping and covering the plurality of thin film transistors; a first conductive unit disposed on the passivation layer to be disconnected electrically from the pixel electrodes; a pixel defining layer formed on the passivation layer to cover edges of the pixel electrodes; an opposite electrode facing the plurality of pixel electrodes, and covering at least part of the first conductive unit; an organic layer, including an emission layer, disposed between the pixel electrodes and the opposite electrode; and a second conductive unit connected electrically to a portion of the opposite electrode and the first conductive unit.

24 Claims, 11 Drawing Sheets

ORGANIC LIGHT-EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 5 of Mar. 2010 and there duly assigned Serial No. 10-2010-0020060.

BACKGROUND OF THE INVENTION

1. Field of the Invention

The present invention relates to organic light-emitting display (OLED) devices and, more particularly, to a transparent organic light-emitting display device.

2. Description of the Related Art

Applications of organic light-emitting display devices range from personal portable devices such as MP3 players and mobile phones to television sets owing to having superior characteristics such as wide viewing angles, high contrast ratios, short response times, and low amounts of power consumption.

An organic light-emitting display device has self-light emitting characteristics, and the weight and thickness of the organic light-emitting display device can be reduced since the organic light-emitting display device does not require an additional light source, unlike a liquid crystal display device.

Also, an organic light-emitting display device can be formed to be a transparent display device by having transparent thin film transistors and transparent organic light-emitting devices.

However, when such a transparent display device is in an off-state, image from an object positioned on a side of the transparent display device opposite to a user may be transmitted to the user through not only patterns of organic light-emitting devices, thin film transistors, and other conductive lines but also through the spaces therebetween. However, in the case of even the transparent display device, since the transmittances of the organic light-emitting device, the thin film transistor, and the other conductive lines are not high and the spaces therebetween are very small, the overall transmittance of the transparent display device is accordingly not high.

Also, the image may appear distorted, caused by the patterns of the organic light-emitting device, the thin film transistor, and the conductive lines. The reason for this is because the gaps between the patterns are only a few nanometers, that is, at a level almost close to the wavelengths of visible light, and thus, the gaps scatter light therethrough.

Furthermore, if an opposite electrode commonly formed over a screen of the transparent display device is formed to a thin thickness so as to improve the transmittance of external light, then a voltage drop, i.e., so called an IR drop, may occur in the opposite electrode. In particular, as organic light-emitting display devices become larger, this phenomenon may become more serious.

SUMMARY OF THE INVENTION

Aspects of the present invention provide an organic light-emitting display device that is formed to be transparent by improving the transmittance of a transmitting region thereof, and in which a voltage drop hardly occurs in an opposite electrode.

Aspects of the present invention also provide a transparent organic light-emitting display device that can prevent distortion of an image transmitted therethrough by preventing light transmitting therethrough from scattering.

According to an aspect of the present invention, an organic light-emitting display device includes: a substrate; a plurality of thin film transistors disposed on a first surface of the substrate; a passivation layer covering the plurality of thin film transistors; a plurality of pixel electrodes disposed on the passivation layer to be connected electrically to the plurality of thin film transistors respectively, and overlapping with the plurality of thin film transistors so as to cover the plurality of thin film transistors; a first conductive unit disposed on the passivation layer to be disconnected electrically from the plurality of pixel electrodes, and formed of a conductive material; a pixel defining layer formed on the passivation layer to cover edges of the each of pixel electrodes; an opposite electrode formed to allow light to pass therethrough, facing the plurality of pixel electrodes, and covering at least one part of the first conductive unit; an organic layer disposed between the plurality of pixel electrodes and the opposite electrode and including an emission layer; and a second conductive unit formed of a conductive material and connected electrically to the opposite electrode and the first conductive unit.

The first conductive unit may be tapered inward from top to bottom.

The first conductive unit may be thicker than the opposite electrode.

The pixel defining layer may include a first aperture adjacent to the plurality of pixel electrodes.

The opposite electrode may be formed in the first aperture.

The opposite electrode may not be formed in the first aperture.

A plurality of the opposite electrodes may be disposed to face the plurality of pixel electrodes, respectively.

The opposite electrode may be disposed to correspond to at least two adjacent pixel electrodes.

The pixel defining layer may include a second aperture for exposing at least one part of the first conductive unit, and the opposite electrode may cover the second apertures.

According to another aspect of the present invention, an organic light-emitting display device includes: a substrate having a transmitting region and a plurality of pixel regions separated from each other by the transmitting region interposed between the pixel regions; a plurality of pixel circuit units formed on a first surface of the substrate, where each of the pixel circuits includes at least one thin film transistor and the plurality of pixel circuit units are positioned in the plurality of pixel regions, respectively; a passivation layer covering the plurality of pixel circuit units and formed to range from the transmission region to all the plurality of pixel regions; a plurality of pixel electrodes disposed on the passivation layer to be electrically connected to the plurality of pixel circuit units located in the pixel regions, respectively, and overlapping with the plurality of pixel circuit units, respectively, to cover the plurality of pixel circuit units; a first conductive unit disconnected electrically from the plurality of pixel electrodes and formed of a conductive material; an opposite electrode formed to allow light to pass throughout, facing the pixel electrode; an organic layer that is interposed between the plurality of pixel electrodes and the opposite electrode to emit light; and a second conductive unit formed of a conductive material and connected electrically to the opposite electrode and the first conductive unit.

The first conductive unit may be tapered inward from top to bottom.

The first conductive unit may be thicker than the opposite electrode.

A pixel defining layer may be formed on the passivation layer to cover edges of the each of pixel electrodes, the pixel defining layer including a first aperture adjacent to the plurality of pixel electrodes.

The opposite electrode may be formed in the first aperture.

The opposite electrode may not be formed in the first aperture.

A plurality of the opposite electrodes may be disposed to face the plurality of pixel electrodes, respectively.

The opposite electrode may be disposed to correspond to at least two adjacent pixel electrodes.

The first conductive unit may be formed on the passivation layer. The pixel defining layer may include a second aperture for exposing at least one part of the first conductive unit. The opposite electrode may cover the second aperture.

The organic light-emitting display device may further include a plurality of conductive lines connected electrically to the plurality of pixel circuit units, respectively. At least one of the plurality of conductive lines of a pixel electrode may be arranged to overlap with the pixel electrode.

The passivation layer may be formed of a transparent material.

The first conductive unit may be disposed between the substrate and the opposite electrode.

A plurality of transparent insulating layers may be disposed on a location corresponding to the transmitting region.

At least one of the plurality of transparent insulating layers may include an aperture on a location corresponding to at least one part of the transmitting region.

The pixel electrode may be a reflection electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
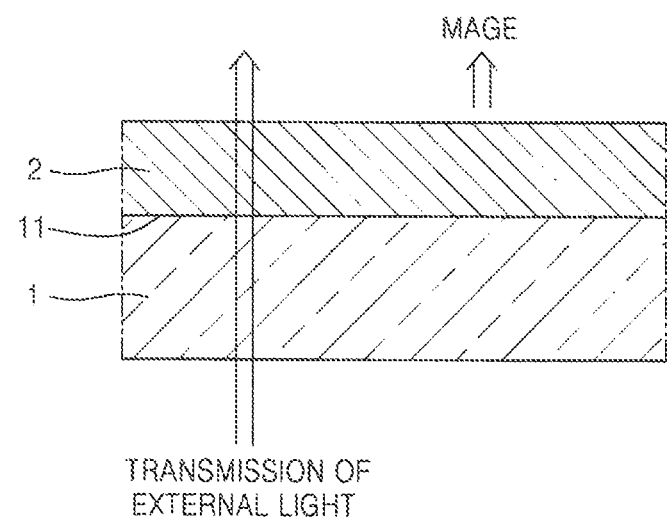
FIG. 1 is a cross-sectional view of an organic light-emitting display device according to an embodiment of the present invention.

FIG. 1 is a cross-sectional view of an organic light-emitting display device according to an embodiment of the present invention.

Referring to FIG. 1, in the organic light-emitting display device, a display unit 2 is formed on a first surface 11 of a substrate 1.

When external light is incident on the organic light emitting display device, the external light sequentially penetrates the substrate 1 and the display unit 2.

As will be described later, the display unit 2 is formed to allow external light to penetrate therethrough. Referring to FIG. 1, the display unit 2 is formed in such a way that a user positioned at a side where an image is displayed can view an image below the substrate 1.

Figure 2:
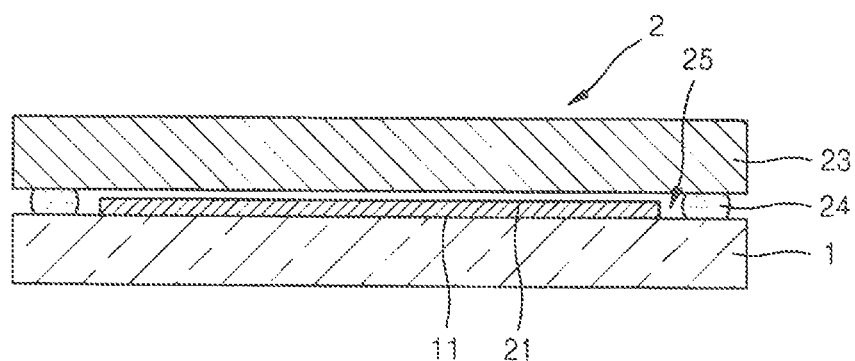
FIG. 2 is a cross-sectional view showing details of the organic light-emitting display device of FIG. 1 according to an embodiment of the present invention.

FIG. 2 is a cross-sectional view showing details of the organic light-emitting display device of FIG. 1 according to an embodiment of the present invention.

The display unit 2 includes an organic emission unit 21 formed on the first surface 11 of the substrate 1 and a sealing substrate 23 for sealing the organic emission unit 21.

The sealing substrate 23 may be formed of a transparent material to allow viewing of an image generated by the organic emission unit 21 and prevents external air and moisture from penetrating into the organic emission unit 21.

Edges of the sealing substrate 23 and the substrate 1 are sealed by a sealant 24, thereby sealing a space 25 between the substrate 1 and the sealing substrate 23. As will be described later, the space 25 may be filled with a desiccant or a filler.

Figure 3:
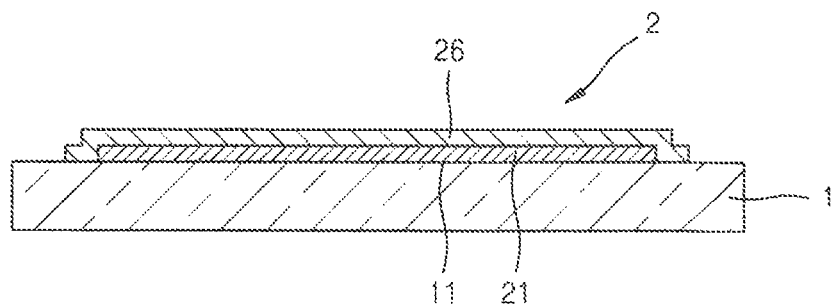
FIG. 3 is a cross-sectional view showing details of the organic light-emitting display device of FIG. 1 according to another embodiment of the present invention.

FIG. 3 is a cross-sectional view showing details of the organic light-emitting display device of FIG. 1 according to another embodiment of the present invention.

As shown in FIG. 3, a thin sealing film 26 may be formed on the organic emission unit 21 to protect the organic emission unit 21 from external air. The thin sealing film 26 may have a structure in which a film formed of an inorganic material, such as silicon oxide or silicon nitride, and a film formed of an organic material, such as epoxy or polyimide, are alternately stacked, but is not limited thereto. For example, the thin sealing film 26 may have any thin film type sealing structure.

Figure 4:
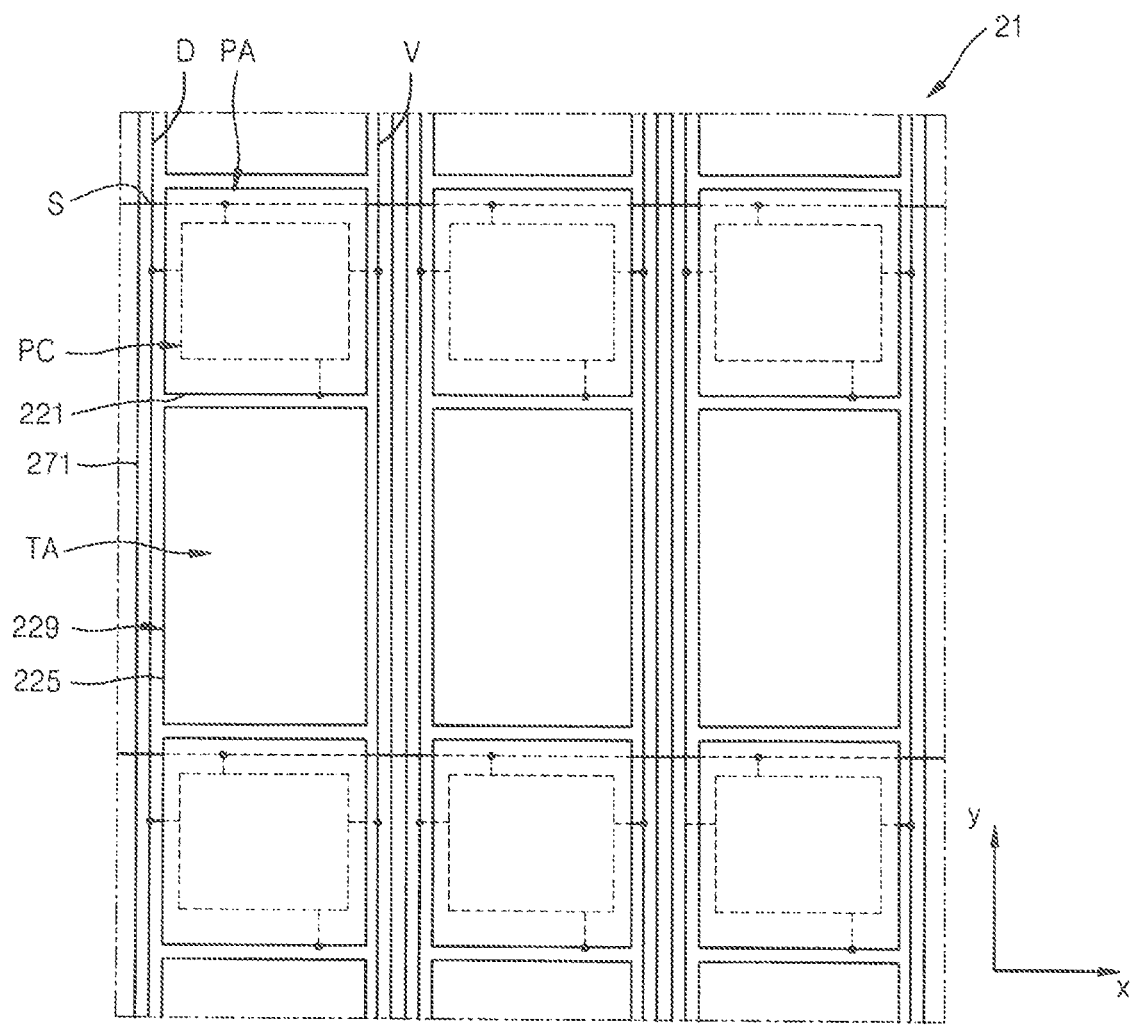
FIG. 4 is a schematic drawing showing an organic emission unit illustrated in FIG. 2 or 3 according to an embodiment of the present invention.
Figure 5:
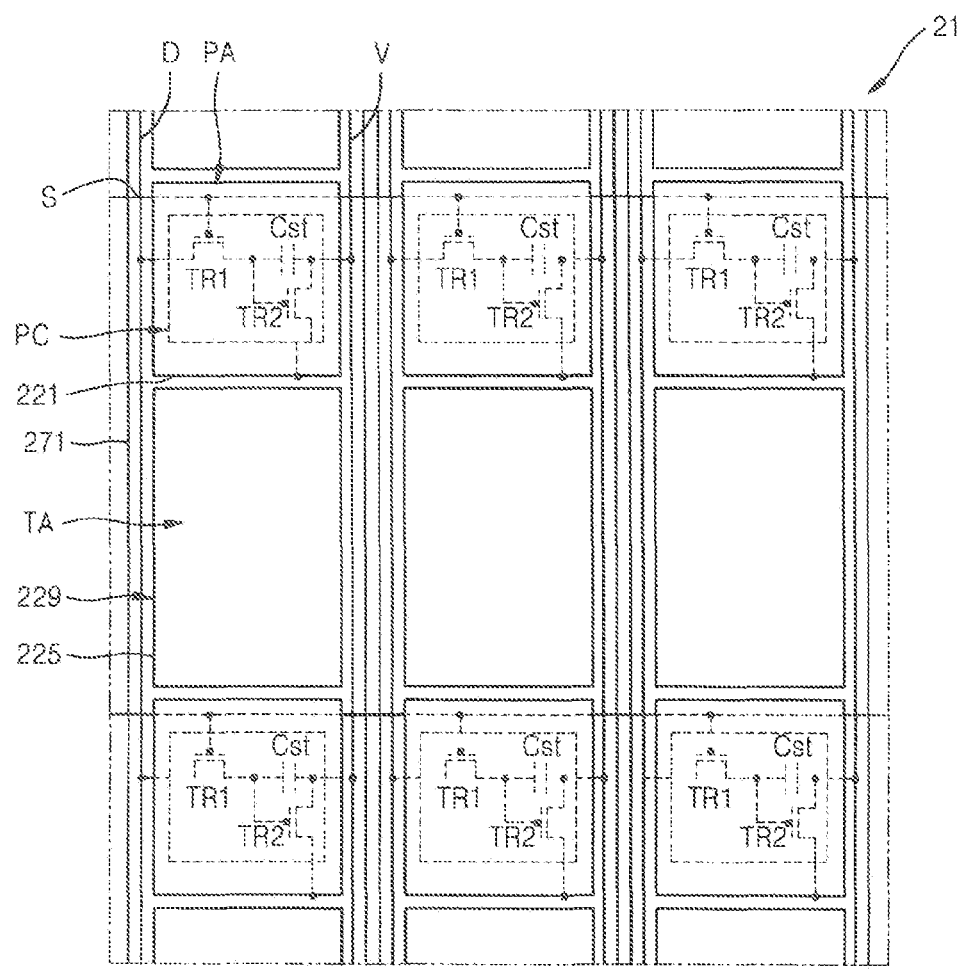
FIG. 5 is a schematic drawing of a plurality of pixel circuit units included in the organic emission unit of FIG. 4 according to an embodiment of the present invention.

FIG. 4 is a schematic drawing showing of the organic emission unit 21 illustrated in FIG. 2 or 3 according to an embodiment of the present invention, while FIG. 5 is a schematic drawing of a plurality of pixel circuit units PC included in the organic emission unit 21 of FIG. 4 according to an embodiment of the present invention.

Referring to FIGS. 2 through 5, according to an embodiment of the present invention, the organic emission unit 21 is formed on the substrate 1 on which transmitting regions TA for transmitting external light and pixel regions PA separated from each other in a y-direction and having the transmitting regions TA interposed therebetween are defined.

Referring to FIG. 4, each of the pixel regions PA includes a pixel circuit unit PC and a pixel electrode 221, and a plurality of conductive lines, such as a scan line S, a data line D, and a voltage (Vdd) line V, are electrically connected to the pixel circuit unit PC. A first conductive unit 271 formed of a conductive material is disposed to be adjacent to the pixel electrode 221. An aperture unit 229 is provided for increasing the transmittance of external light of the transmitting regions TA. Although not shown, various other conductive lines besides the scan line S, the data line D, and the Vdd line V may further be connected to the pixel circuit unit PC according to the configuration of the pixel circuit unit PC.

Referring to FIG. 5, the pixel circuit unit PC includes a first thin film transistor (TFT) TR1 connected to the scan line S and the data line D, a second TFT TR2 connected to the first TFT TR1 and the Vdd line V, and a storage capacitor Cst connected to the first and second TFTs TR1 and TR2. At this point, the first TFT TR1 is a switching transistor and the second TFT TR2 is a driving transistor. The second TFT TR2 is electrically connected to a pixel electrode 221. In FIG. 5, the first and second TFTs TR1 and TR2 are P-type transistors but are not limited thereto, and at least one of the first and second TFTs TR1 and TR2 may be an N-type transistor. The present invention is not limited to the first and second TFTs TR1 and TR2 and the capacitor Cst, and more than two TFTs and more than one capacitor may be included in the pixel circuit unit PC according to the configuration of the pixel circuit unit PC.

Referring to FIGS. 4 and 5, the scan line S is disposed across the pixel electrode 221 to overlap with the pixel electrode 221 and the data line D, and the Vdd line V is disposed beside the pixel electrode 221 not to overlap with the pixel electrode 221. However, the present invention is not limited thereto and at least one of the conductive lines including the scan line S, the data line D, ad the Vdd line V may be disposed to overlap with the pixel electrode 221. In some cases, all the conductive lines including the scan line S, the data line D, and the Vdd line V may be disposed adjacent to the pixel electrode 221.

Each of the pixel regions PA is a light emitting region of a sub pixel. Since the pixel circuit unit PC is located in each of the light emitting regions, a user may see an outside view through the display device via the transmitting regions TA. That is, since conductive patterns of the pixel circuit unit PC, which may reduce the transmittance of light, are not located in the transmitting region TA, the transmittance of the transmitting region TA is improved.

As described above, according to an embodiment of the present invention, each of pixels of the organic emission unit 21 is divided into the pixel regions PA and the transmitting regions TA, and most of conductive patterns, which may reduce the overall transmittance of a display device, are located in the pixel regions, thereby improving the transmittance of the transmitting regions TA. Accordingly, the transmittance of the whole region in which an image is realized (the organic emission unit 21 of FIG. 2 or 3) is higher than in a conventional transparent display device.

Also, since the pixel regions PA are separated from the transmitting regions TA, it is possible to prevent external image distortion caused by scattering of external light due to the conductive patterns of devices in the pixel circuit units PC when a user looks through the transmitting regions TA.

Even if the conductive lines including the scan line S, the data line D, and the Vdd line V are disposed to cross the transmitting region TA between the pixel regions PA, the conductive lines are very thin. Thus, the conductive lines can hardly be observed by the user and have little effect on the overall transmittance of the organic emission unit 21. Accordingly, a transparent display device can be realized. Also, even if the user cannot see an external image as much in regions covered by the pixel regions PA, in consideration of the overall display region, there is little effect on observing the external image since the pixel regions PA are like a plurality of dots regularly arranged on a surface of a transparent glass.

The transmitting regions TA and the pixel regions PA are formed in such a way that the ratio of the area of the transmitting regions TA to the overall area of the transmitting regions TA and the pixel regions PA is about 5% to 90%.

If the ratio of the area of the transmitting regions TA to the overall area of the transmitting regions TA and the pixel regions PA is less than 5%, then the user can hardly see an object or image on a side opposite to the user due to lack of light that can transmit through the display unit 2 of FIG. 1 when the display 2 unit is in an off-state. That is, it cannot be said that the display unit 2 is transparent. If the ratio of the area of the transmitting regions TA to the overall area of the transmitting regions TA and the pixel regions PA is approximately 5%, then the pixel regions PA are present in an island state with respect to the transmitting regions TA, and scattering of solar light is minimized since most of conductive patterns are disposed in the pixel regions PA. Thus, the display unit 2 may be recognized as a transparent display unit by the user. As will be described later, when a TFT included in the pixel circuit unit PC is a transparent TFT such as an oxide semiconductor and an organic light emitting device is a transparent device, the display unit 2 is highly likely to be recognized as a transparent display unit.

If the ratio of the area of the transmitting regions TA to the entire area of the pixel regions PA and the transmitting regions TA is greater than 90%, then pixel integrity of the display unit 2 is excessively reduced, and thus, a stable image can hardly be realized through light emission from the pixel regions PA. That is, as the area of the pixel regions PA is reduced, the brightness of light emitted from an organic layer 223, which will be described later with respect to FIGS. 7 and 8, should be increased in order to realize an image. However, if the organic light emitting device is operated to emit light having a high brightness, the lifetime of the organic light emitting device rapidly reduces. Also, when the ratio of the area of the transmitting regions TA to the entire area of the pixel regions PA and the transmitting regions TA is greater than 90% while the size of a single pixel region PA is maintained at an appropriate size, the number of pixel regions PA is reduced, and the resolution of the organic light emitting device is reduced accordingly.

The ratio of the area of the transmitting regions TA to the entire area of the pixel regions PA and the transmitting regions TA may preferably be in a range of 20% to 70%.

If the ratio of the area of the transmitting regions TA to the entire area of the pixel regions PA and the transmitting regions TA is less than 20%, the ratio of the area of the transmitting regions TA to the area of the pixel regions PA is small. Thus, observing of an external image through the transmitting regions TA is limited. If the ratio of the area of the transmitting regions TA to the entire area of the pixel regions PA and the transmitting regions TA exceeds 70%, there are a lot of limitations in designing the pixel circuit unit PC.

Each of the pixel regions PA includes the pixel electrode 221 electrically connected to the pixel circuit unit PC. The pixel circuit unit PC overlaps with the pixel electrode 221 so that the pixel circuit unit PC may be covered by the pixel electrode 221. Also, at least one of the conductive lines including the scan line S, the data line D, and the Vdd line V may be disposed to cross the pixel electrode 221. Since the conductive lines reduce the transmittance of light less than the pixel circuit unit PC, all the conductive lines may be disposed adjacent to the pixel electrode 221 according to design conditions.

According to an embodiment of the present invention, the pixel electrode 221 may have an area equal to or slightly greater than that of the pixel region PA. Accordingly, when the user observes the organic emission unit 21, the pixel circuit unit PC described above is covered by the pixel electrode 221. Therefore, the user can see only a portion of the conductive lines through the transmitting regions TA, and the overall transmittance of the display device is thus improved as described above. Accordingly, the user can easily view an external image through the transmitting regions TA.

In an embodiment of the present invention, an aperture unit 229 is formed in each of a plurality of insulating layers corresponding to at least one part of the transmitting regions TA in order to increase the transmittance of external light of the transmitting regions TA. This will be described later.

Figure 6:
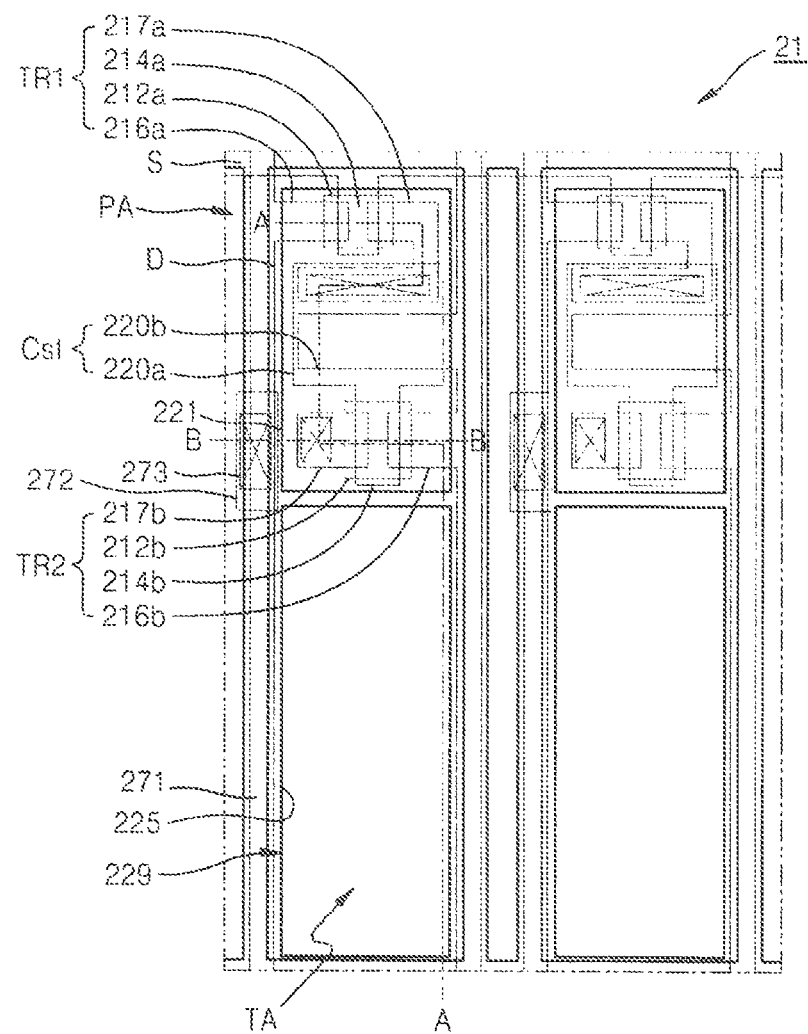
FIG. 6 is a plan view specifically illustrating the organic emission unit of FIG. 5 according to an embodiment of the present invention.
Figure 7:
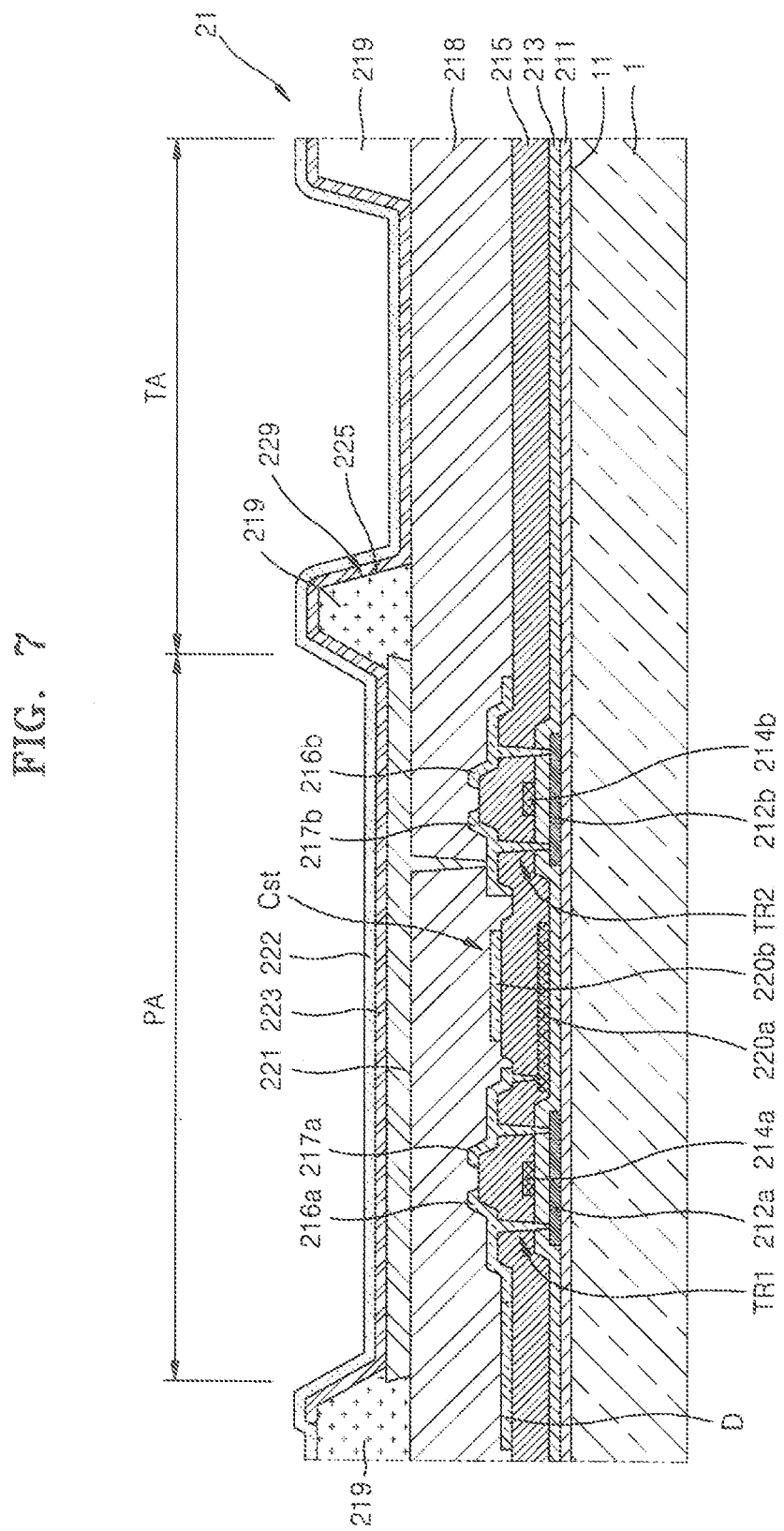
FIG. 7 is a cross-sectional view taken along a line A-A of FIG. 6.
Figure 8:
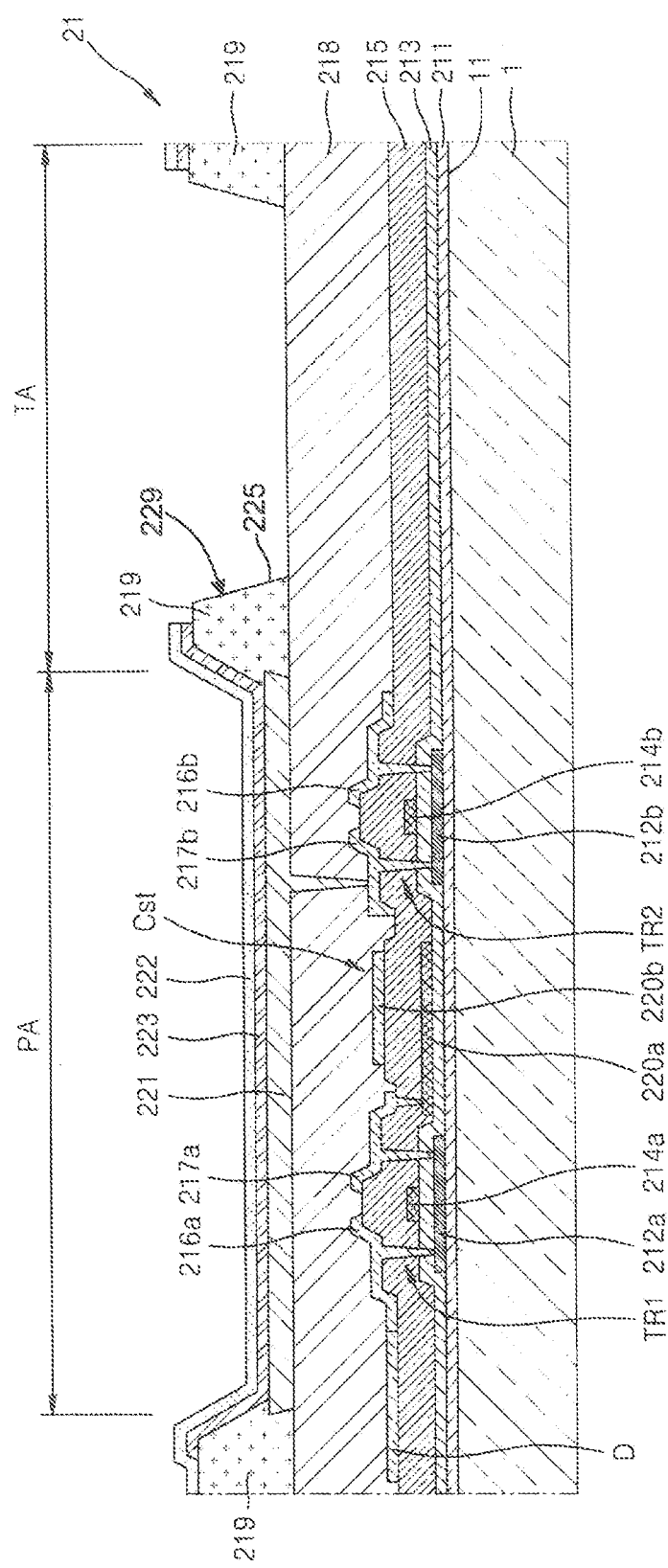
FIG. 8 is an alternative cross-sectional view taken along a line A-A of FIG. 6.
Figure 9:
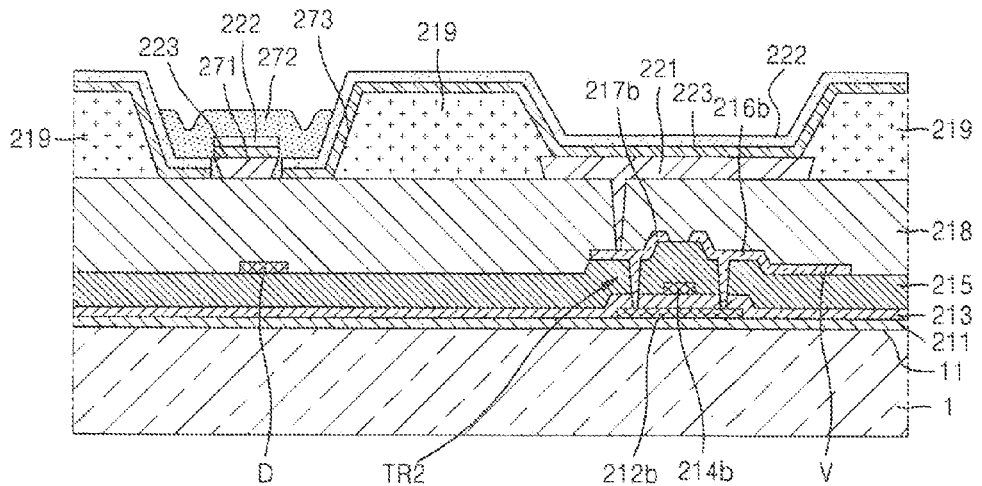
FIG. 9 is a cross-sectional view taken along a line B-B of FIG. 6.

FIG. 6 is a plan view specifically illustrating of the organic emission unit 21 of FIG. 5 according to an embodiment of the present invention, in which the pixel circuit unit PC of FIG. 5 is illustrated in detail, FIG. 7 is a cross-sectional view taken along a line A-A of FIG. 6, FIG. 8 is an alternative cross-sectional view taken along a line A-A of FIG. 6, while FIG. 9 is a cross-sectional view taken along a line B-B of FIG. 6.

Referring to FIGS. 6, 7 and 8, a buffer layer 211 is formed on the first surface 11 of the substrate 1.

The buffer layer 211 prevents impurity elements from penetrating into the organic emission unit 21 and planarizes a surface of the substrate 1. The buffer layer 211 may be formed of any of various materials that can perform the functions described above. For example, the buffer layer 21 may be formed of an inorganic material, such as a silicon oxide, a silicon nitride, a silicon oxynitride, an aluminum oxide, an aluminum nitride, a titanium oxide, or a titanium nitride, an organic material, such as polyimide, polyester, or acryl, or stacks of these materials. The buffer layer 211 is not an essential element and may not be formed.

First TFT TR1, capacitor Cst, and second TFT TR2 are then formed on the buffer layer 211 as follows.

First, for first TFT TR1 and second TFT TR2, a first semiconductor active layer 212a and a second semiconductor active layer 212b are formed on the buffer layer 211.

The first and second semiconductor active layers 212a and 212b may be formed of polycrystal silicon, but are not limited thereto and may be formed of a semiconductor oxide. For example, the first and second semiconductor active layers 212a and 212b may each be a G-I-Z-O layer $\{(In_2O_3)a(Ga_2O_3)b(ZnO)c$ layer$\}$, where a, b, and c are integers that respectively satisfy $a \geq 0$, $b \geq 0$, and $c > 0$. When the first and second semiconductor active layers 212a and 212b are formed of a semiconductor oxide, the optical transmittance thereof can further be improved.

A gate insulating layer 213 is formed on the buffer layer 211 and covers the first and second semiconductor active layers 212a and 212b. First and second gate electrodes 214a and 214b are formed on the gate insulating layer 213. Additionally, a lower electrode 220a for capacitor Cst is simultaneously formed with the first and second gate electrodes 214a and 214b. Further, the scan line S (FIG. 6) may be formed simultaneously with the first and second gate electrodes 214a and 214b, and may be connected to the first gate electrode 214a (FIG. 5).

An interlayer insulating layer 215 is formed on the gate insulating layer 213 and covers the first and second gate electrodes 214a and 214b and the lower electrode 220a.

A first source electrode 216a, a first drain electrode 217a, a second source electrode 216b, and a second drain electrode 217b are each formed on the interlayer insulating layer 215, and are connected to the first semiconductor active layer 212a and the second semiconductor active layer 212b through contact holes, respectively, and an upper electrode 220b for capacitor Cst is simultaneously formed with the first drain electrode 217a.

The data line D may be formed simultaneously with the first source electrode 216a and may be connected to the first source electrode 216a.

The Vdd line V (FIG. 9) may be formed simultaneously with the second source electrode 216b and may be connected to the second source electrode 216b.

The structures of the first TFT TR1, the capacitor Cst, and the second TFT TR2 are not limited thereto and any of various types of TFT and capacitor structures may be employed. For example, referring to FIG. 7, each of the first and second TFTs TR1 and TR2 has a top gate structure but may have a bottom gate structure in which the first and second gate electrodes 214a and 214b are located below the first and second semiconductor active layers 212a and 212b, respectively. However, any other TFT structure may be employed.

A passivation layer 218 is formed to cover the first TFT TR1, the capacitor Cst, and the second TFT TR2. The passivation layer 218 may be a single layer or multiple layers of insulating layer, an upper surface of which is planarized. The passivation layer 218 may be formed of an inorganic material and/or an organic material.

Referring to FIGS. 6, 7 and 8, the pixel electrode 221 may be formed on the passivation layer 218 to cover the first TFT TR1, the capacitor Cst, and the second TFT TR2. The pixel electrode 221 is connected to the second drain electrode 217b of the second TFT TR2 through a via hole formed in the passivation layer 218. Referring to FIG. 6, a plurality of the pixel electrodes 221 are formed in an island pattern to be independent from each other in units of pixels.

Referring back to FIGS. 7 and 8, a pixel defining layer 219 is formed on the passivation layer 218 to cover edges of the pixel electrodes 221. An organic layer 223 and an opposite electrode 222 are sequentially formed on the pixel electrode 221. The organic layer 223 and opposite electrode 222 is formed on all the pixel regions PA and the transmitting regions TA in FIG. 7. Alternatively, as shown in FIG. 8, the organic layer 223 and opposite electrode 222 is formed on all the pixel regions PA but not in a first aperture 225 of the transmitting regions TA.

The organic layer 223 may be a low molecular weight organic layer or a polymer organic layer. If the organic layer 223 is a low molecular weight organic layer, then the organic layer 223 may be formed by stacking a hole injection layer (HIL), a hole transport layer (HTL), an emission layer (EML), an electron transport layer (ETL), and an electron injection layer (EIL) in a single structure or a composite structure. In this case, the organic layer 223 may be formed of any of various materials, such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic layer may be formed by vacuum deposition. In this case, the EML may be formed independently for each of red, green, and blue pixels, and the HIL, the HTL, the ETL, and the EIL may be common layers to be commonly applied to the red, green, and blue pixels. Accordingly, as illustrated in FIG. 7, the common layers be formed to cover all the pixel regions PA and the transmitting regions TA, similar to the opposite electrode 222.

The pixel electrode 221 may function as an anode and the opposite electrode 222 may function as a cathode. Of course, the polarities of the pixel electrode 221 and the opposite electrode 222 may be reversed.

The pixel electrode 221 has a size corresponding to that of the pixel region PA for each of the red, green, and blue pixels. Actually, the size of a portion of the pixel electrode 221 that is not covered by the pixel defining layer 219 is equal to or slightly less than that of the pixel region PA for each of the red, green, and blue pixels. The opposite electrode 222 may be formed as a common electrode covering all pixels of the organic emission unit 21.

According to an embodiment of the present invention, the pixel electrode 221 may be a reflection electrode and the opposite electrode 222 may be a transparent electrode. Thus, the organic emission unit 21 is a top emission type, in which light is emitted toward the opposite electrode 222.

To this end, the pixel electrode 221 may include a reflection layer formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), a compound of these materials, or an oxide having a relatively high work function such as ITO, IZO, ZnO, or $In_2O_3$. The opposite electrode 222 may be formed of a metal having a relatively low work function such as Ag, Mg, Al, Pt, Pd, Au, Ni, Nd, Ir, Cr, Li, Ca, or an alloy thereof. The opposite electrode 222 may be formed of a thin layer having a thickness between about 100 Å to about 300 Å so that the transmission thereof may be improved. Although not shown, an additional transparent protective layer may further be formed on the opposite electrode 222.

If the pixel electrode 221 is a reflection electrode, then the pixel circuit unit PC disposed under the pixel electrode 221 is covered by the pixel electrode 221. Thus, referring to FIG. 7, at upper outer sides of the opposite electrode 222, a user cannot observe the patterns of the first TFT TR1, the capacitor Cst, and the second TFT TR2 disposed under the pixel electrode 221.

Also, if the pixel electrode 221 is a reflection electrode, then light is emitted only toward the user, thereby reducing an amount of light lost in a direction opposite to the user. Also, since the pixel electrode 221 covers various patterns on the pixel circuit unit PC disposed under the pixel electrode 221 as described above, the user may view a clear image.

However, the present invention is not limited thereto and the pixel electrode 221 may be a transparent electrode. If the pixel electrode 221 is a transparent electrode, then the pixel electrode 221 may be formed of only an oxide having a relatively high work function, such as ITO, IZO, ZnO, or $In_2O_3$. If the pixel electrode 221 is transparent, at the upper outer sides of the opposite electrode 222, the user can view the first TFT TR1, the capacitor Cst, and the second TFT TR2 disposed under the pixel electrode 221. However, although the pixel electrode 221 is transparent, there is a loss of light since the transmittance of light therethrough cannot be 100%, and the transmittance of external light is further reduced due to the pixel electrode 221 since the conductive patterns are disposed in the region of the pixel electrode 221. Therefore, interference due to the conductive patterns on the external light is reduced as compared to when the external light directly enters the conductive patterns, thereby reducing distortion of an external image.

The buffer layer 211, the gate insulating layer 213, the interlayer insulating layer 215, the passivation layer 218, and the pixel defining layer 219 may all be formed as transparent insulating layers. At this point, the substrate 1 has a transmittance greater than or equal to the total transmittance of the transparent insulating layers.

In an embodiment of the present invention, aperture units 229 are formed in at least one part of a plurality of insulating layers corresponding to at least one part of the transmitting regions TA in order to increase the transmittance of external light of the transmitting regions TA, to prevent optical interference caused by multilayered transparent insulating layers in the transmitting regions TA, and to prevent a degradation in color caused by the optical interference.

In order to increase the transmittance of external light of the transmitting regions TA, the transmitting regions TA should be widened or the transmitting regions TA should be formed of a material having a relatively higher transmittance. However, there is a restriction in widening the transmitting regions TA due to a restriction in design of the pixel circuit units PC. Thus, the transmitting regions TA should be formed of a material having a high transmittance in order to increase the transmittance of external light of the transmitting regions TA. However, in this case, a number of usable materials having a sufficiently high transmittance is fairly limited.

Accordingly, the aperture units 229 are formed in at least one part of the insulating layers corresponding to at least one part of the transmitting regions TA.

Referring to FIGS. 6, 7 and 8, the aperture unit 229 includes the first aperture 225 in the pixel defining layer 219 on the passivation layer 218. The passivation layer 218 is exposed via the first aperture 225.

Referring to FIG. 6, the aperture unit 229 is formed as wide as possible within the transmitting region TA so as to function as a transmitting window. A plurality of the aperture units 229 may be disposed to be adjacent to the plurality of pixel regions PA, respectively. Accordingly, the user may observe an image under the substrate 1 via the aperture unit 229, which may be a transmitting window.

Referring to FIG. 7, the aperture unit 229 includes only the first aperture 225 formed in the pixel defining layer 219 but the present invention is not limited thereto. The aperture unit 229 may further include any of other apertures that are formed in at least one from among the passivation layer 218, the interlayer insulating layer 215, the gate insulating layer 213, and the buffer layer 211 to be connected to the first aperture 225. In this case, the transmittance of the aperture unit 229 may further be improved. The aperture unit 229 may be formed as wide as possible as long as it does not interrupt the scan line S, the data line D, and the Vdd line V.

Referring to FIGS. 6 and 9, a first conductive unit 271 formed of a conductive material is disposed on the passivation layer 218 to be adjacent to the pixel electrode 221. For convenience of manufacturing, the first conductive unit 271 may be formed of the same material as that of the pixel electrode 221 but is not limited thereto and may be formed in a similar manner to and may be formed of the same material as one of a plurality of layers constituting the pixel electrode 221. Otherwise, the first conductive unit 271 may be formed in a similar manner to and may be formed of the same material as the scan line S or the data line D.

As will be described in detail later, the first conductive unit 271 is electrically connected to the opposite electrode 222 in order to prevent a voltage drop from occurring in the opposite electrode 222. Referring to FIG. 6, the first conductive unit 271 may be formed in a mesh pattern to surround one aperture unit 229 and one pixel electrode 221.

In this case, the first conductive unit 271 is formed to taper from top to bottom as illustrated in FIG. 9. The pixel defining layer 219 includes a second aperture 273 to expose the first conductive unit 271. The first conductive unit 271 is formed to be thicker than the opposite electrode 222.

Thus, when the organic layer 223 and the opposite electrode 222 are formed to cover the first conductive unit 271 and the second aperture 273, the covering is discontinuous due to the first conductive unit 271 tapered inward from top to bottom. In particular, since the opposite electrode 222 is formed to a thin thickness of about 200 Å, the opposite electrode 222 and the first conductive unit 271 cannot be connected electrically to each other.

To solve this problem, in the current embodiment, the second conductive unit 272 is formed on the opposite electrode 222 by using a conductive material so that the second conductive unit 272 can be connected electrically to the opposite electrode 222 and the first conductive unit 271, thereby electrically connecting the opposite electrode 222 to the first conductive unit 271.

The second conductive unit 272 may be formed of a conductive material, for example, a transparent conductive material, such as an ITO, an IZO, a ZnO, or an $In_2O_3$, a metal material, such as Ag, Mg, Al, Pt, Pd, Au, Ni, Nd, Ir, Cr, Li, Ca, or a compound of these materials.

The second conductive unit 272 may be formed to cover the second aperture 273. Referring to FIG. 6, the second conductive unit 272 is disposed adjacent to each of the pixel electrodes 221 in order not to reduce the transmittance of the aperture unit 229.

Although FIG. 9 illustrates that the first conductive unit 271 is formed on the passivation layer 218, the first conductive unit 271 may be formed on the interlayer insulating layer 215 as long as the first conductive unit 271 does not overlap with the data line D and may be formed on the gate insulating layer 213 as long as the first conductive unit 271 does not overlap with the scan line S. Otherwise, the first conductive unit 271 may be formed on the buffer layer 211.

If the first conductive unit 271 and the opposite electrode 222 are connected electrically to each other via the second conductive unit 272 as described above, it is possible to prevent a voltage drop from occurring in the opposite electrode 222 even when the opposite electrode 222 is formed by using a thin film.

FIGS. 10 through 14 are plan views of an organic emission unit according to another embodiment of the present invention.

Figure 10:
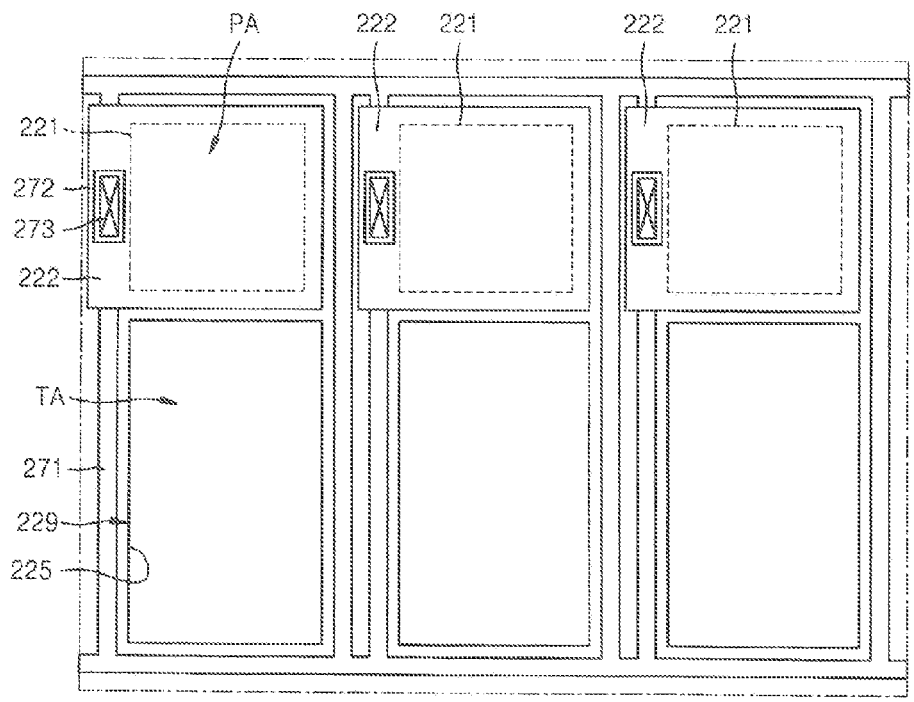
FIG. 10 is a plan view of an organic emission unit according to another embodiment of the present invention.

Referring to FIG. 10, a plurality of opposite electrodes 222 are formed to correspond to a plurality of pixel electrodes 221, respectively. That is, each of the opposite electrodes 222 is formed in an island pattern to face a corresponding pixel electrode 221. In this case, each of the opposite electrodes 222 is connected electrically to a first conductive unit 271 via a second conductive unit 272 and second aperture 273.

The first conductive unit 271 is disposed to be connected to all pixels and is connected to an external power source (not shown). Thus, common power supply voltage is applied to each of the opposite electrodes 222 via the first conductive unit 271.

In the organic emission unit according to the current embodiment, the opposite electrodes 222 do not cover an aperture unit 229 in a transmitting region TA, and thus, the transmittance of the transmitting region TA, and particularly, the transmittance of the aperture unit 229, may be improved greatly, thereby improving the overall transmittance of the organic emission unit.

Figure 11:
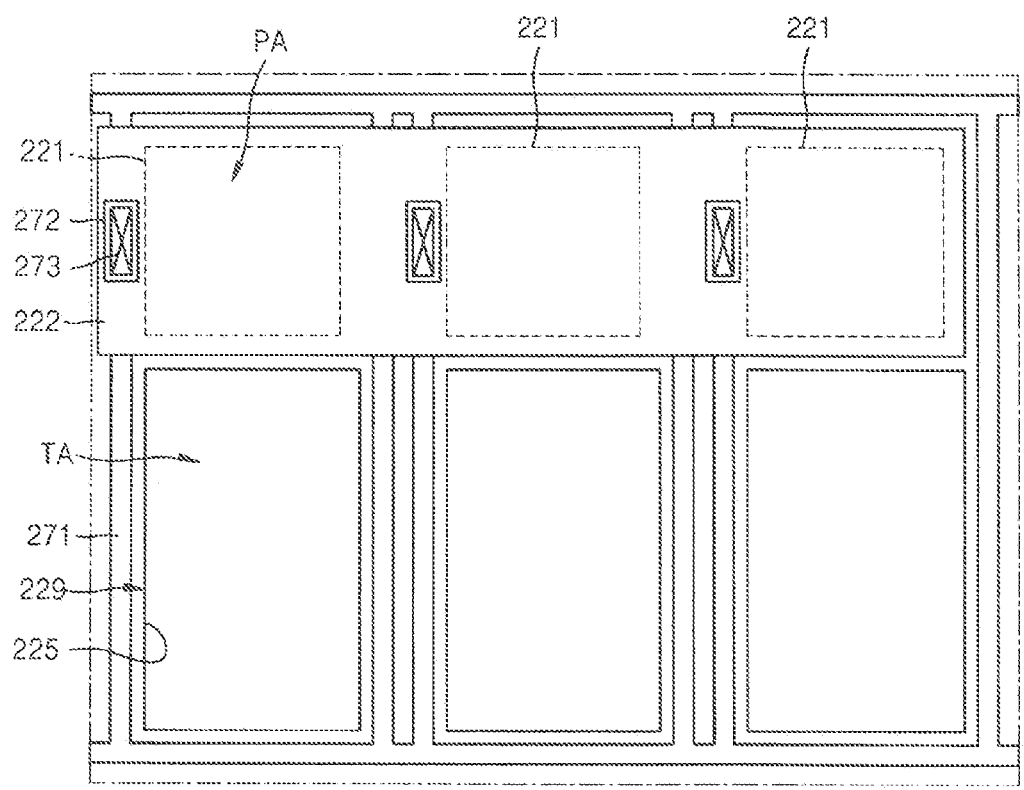
FIG. 11 is a plan view of an organic emission unit according to another embodiment of the present invention.

Referring to FIG. 11, the opposite electrode 222 may be formed in a line so as to be extended from one pixel to adjacent pixels. In this case, common power supply voltage is also applied to the opposite electrodes 222 via a first conductive unit 271 as described. It is easier to form the opposite electrodes 222 in the organic emission unit according to the current embodiment than in the organic emission unit of FIG. 10.

Figure 12:
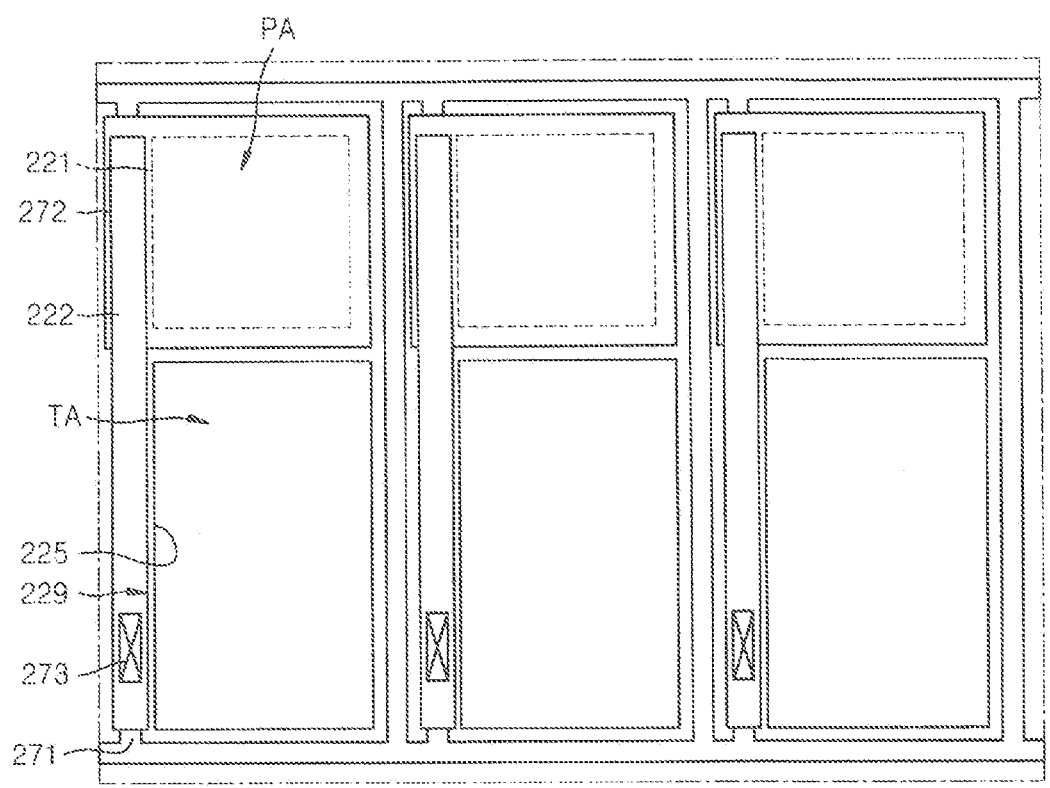
FIG. 12 is a plan view of an organic emission unit according to another embodiment of the present invention.
Figure 13:
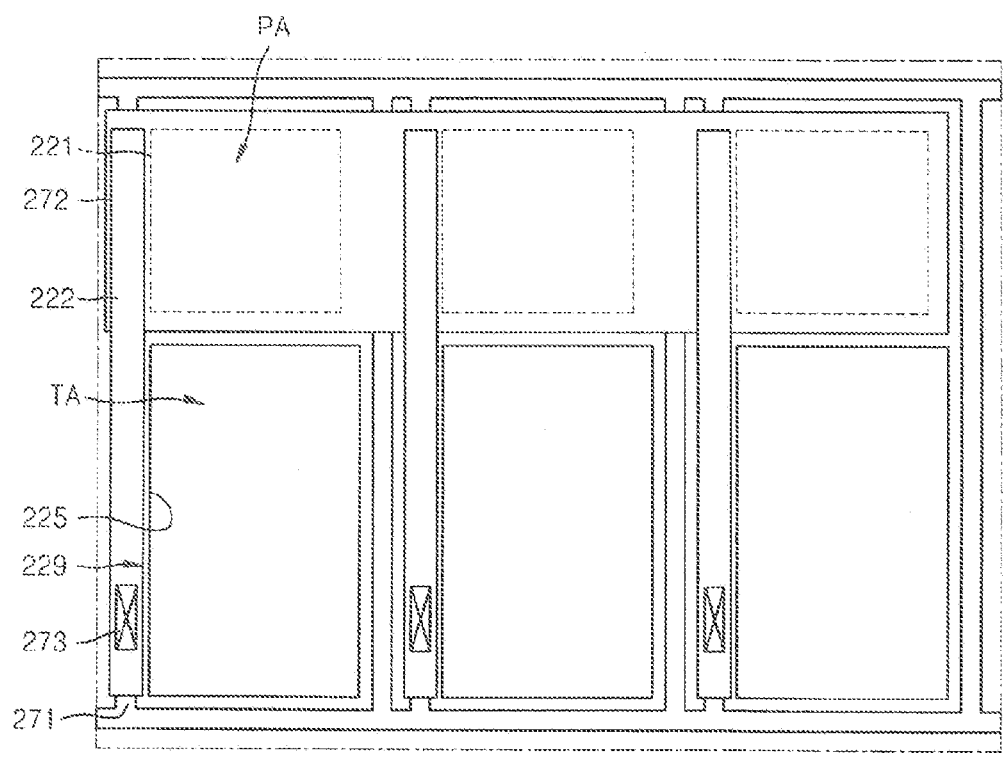
FIG. 13 is a plan view of an organic emission unit according to another embodiment of the present invention.

The second conductive unit 272 may be formed in such a way that only regions adjacent to the pixel electrodes 221 are patterned as illustrated in FIGS. 10 and 11 or may be formed to be extended adjacent to the aperture unit 229 as long as the second conductive unit 272 does not overlap with the aperture unit 229 as illustrated in FIGS. 12 and 13. In this case, the area of the second conductive unit 272 is increased, and thus, it is possible to increase a possibility that a voltage drop will be prevented from occurring in the opposite electrodes 222.

Figure 14:
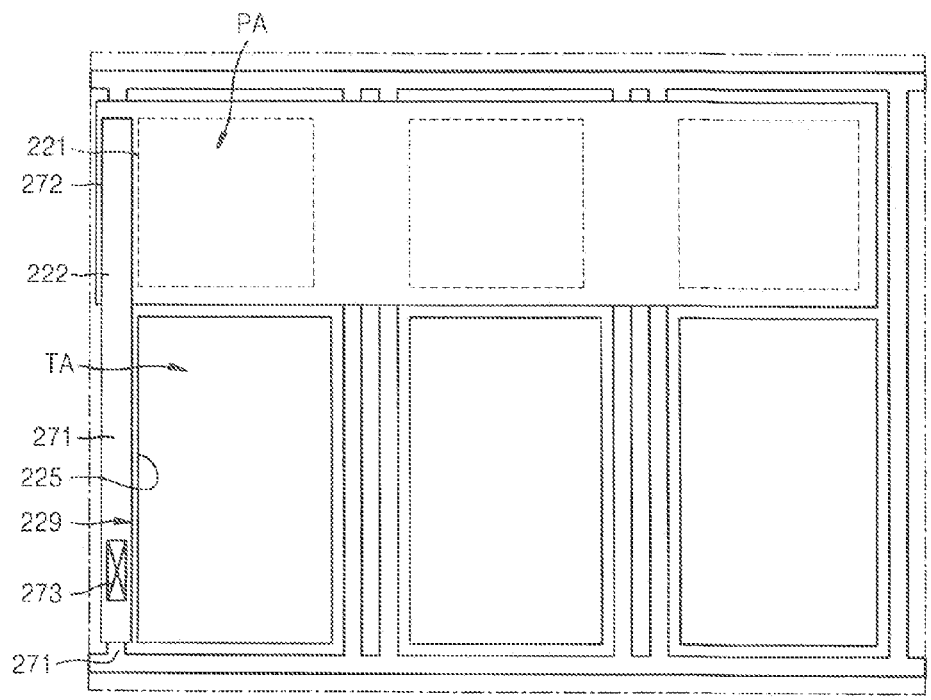
FIG. 14 is a plan view of an organic emission unit according to another embodiment of the present invention.

Also, in order to improve the transmittance of the organic emission unit and convenience of manufacturing, a second conductive unit 272 may be formed to correspond to a plurality of pixels, respectively, as illustrated in FIG. 14.

The second aperture 273 through which the second conductive unit 272 contacts the first conductive unit 271 is located adjacent to the pixel electrode 221 in the embodiments of FIGS. 9 to 11 but is not limited thereto and may be located beside the aperture unit 229, which is a transmitting window, as shown in FIGS. 12-14. In this case, the brightness of a pixel region PA may be maintained at a constant appropriate level.

Figure 15:
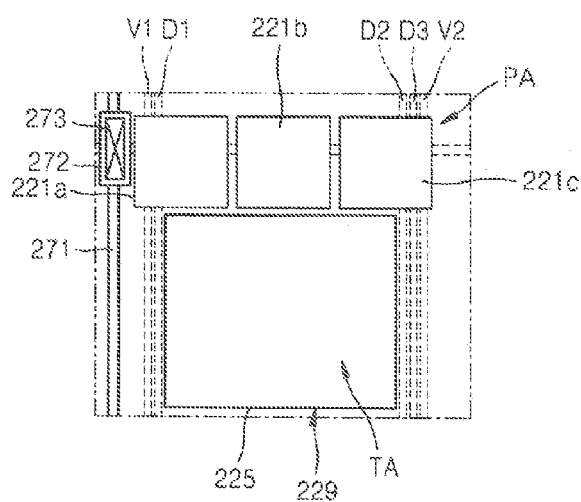
FIG. 15 is a plan view of an organic emission unit according to another embodiment of the present invention.

FIG. 15 is a plan view of an organic emission unit according to another embodiment of the present invention.

In the current embodiment, an aperture unit 229 is formed to correspond to a first pixel electrode 221a, a second pixel electrode 221b, and a third pixel electrode 221c. That is, if the first pixel electrode 221a, the second pixel electrode 221b, and the third pixel electrode 221c are pixel electrodes to realize red, green, and blue colors, respectively, then the aperture unit 229 is formed in such a way that a side thereof corresponds to the first pixel electrode 221a, the second pixel electrode 221b, and the third pixel electrode 221c. That is, in the current embodiment, the aperture unit 229 is identical to a combination of three apertures 229 illustrated in FIGS. 10 to 14.

Referring to FIG. 15, first to third data lines D1 to D3 are connected electrically to the first to third pixel electrodes 221a to 221c, respectively. Also, a first Vdd line V1 is connected electrically to the first pixel electrode 221a and the second pixel electrode 221b, and a second Vdd line V2 is connected electrically to the third pixel electrode 221c.

In the organic emission unit of FIG. 15, one large aperture unit 229 corresponds to a plurality of sub pixels, and thus, the transmittance of the organic emission unit may be further improved and image distortion caused by optical dispersion may further be reduced.

In this case, not only a first conductive unit 271 but also the second aperture 273 and the second conductive unit 272 are disposed adjacent to the first pixel electrode 221a or the third pixel electrode 221c (not shown), thereby preventing a degradation in the transmittance of the aperture unit 229 to a large extent.

All the matters defined in the embodiments of FIGS. 10 to 14 may also be applied to the embodiment of FIG. 15.

According to the above embodiments of the present invention, it is possible to manufacture a transparent organic light-emitting display device by increasing the transmittance of external light and to minimize a voltage drop in an opposite electrode by reducing surface resistance of the opposite electrode.

Also, it is possible to manufacture a transparent organic light-emitting display device, in which image distortion is prevented by suppressing dispersion of light transmitted therethrough.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display device, comprising:
a substrate;
a plurality of thin film transistors disposed on a first surface of the substrate;
a passivation layer covering the plurality of thin film transistors;
a plurality of pixel electrodes disposed on the passivation layer to be connected electrically to corresponding ones of the plurality of thin film transistors, and overlapping with the corresponding ones of the plurality of thin film transistors so as to cover the corresponding ones of the plurality of thin film transistors;
a first conductive unit disposed on the passivation layer to be disconnected electrically from the plurality of pixel electrodes, and formed of a conductive material;
a pixel defining layer formed on the passivation layer to cover edges of the each of pixel electrodes;
an opposite electrode formed to allow light to pass therethrough, facing the plurality of pixel electrodes, and covering at least one part of the first conductive unit;
an organic layer disposed between the plurality of pixel electrodes and the opposite electrode and including an emission layer; and
a second conductive unit formed of a conductive material, covering and connected electrically to the first conductive unit and the opposite electrode covering the at least one part of the first conductive unit,
wherein the second conductive unit does not overlap the pixel electrodes.

2. The organic light-emitting display device of claim 1, wherein the first conductive unit is tapered inward from top to bottom.

3. The organic light-emitting display device of claim 1, wherein the first conductive unit is thicker than the opposite electrode.

4. The organic light-emitting display device of claim 1, wherein the pixel defining layer comprises a first aperture adjacent to the plurality of pixel electrodes.

5. The organic light-emitting display device of claim 4, wherein the opposite electrode is formed in the first aperture.

6. The organic light-emitting display device of claim 4, wherein the opposite electrode is not formed in the first aperture.

7. The organic light-emitting display device of claim 1, wherein a plurality of the opposite electrodes are disposed to face the plurality of pixel electrodes, respectively.

8. The organic light-emitting display device of claim 1, wherein the opposite electrode is disposed to correspond to at least two adjacent pixel electrodes.

9. The organic light-emitting display device of claim 1, wherein:
the pixel defining layer comprises a second aperture for exposing at least one part of the first conductive unit, and the opposite electrode covers the second aperture.

10. An organic light-emitting display device, comprising:
a substrate having a transmitting region and a plurality of pixel regions separated from each other by the transmitting region interposed between the pixel regions;
a plurality of pixel circuit units formed on a first surface of the substrate, where each of the pixel circuits includes at least one thin film transistor and the plurality of pixel circuit units are positioned in the plurality of pixel regions, respectively;
a passivation layer covering the plurality of pixel circuit units and formed to range from the transmission region to all the plurality of pixel regions;
a plurality of pixel electrodes disposed on the passivation layer to be electrically connected to corresponding ones of the plurality of pixel circuit units located in the pixel regions, and overlapping with the corresponding ones of the plurality of pixel circuit units to cover the corresponding ones of the plurality of pixel circuit units;
a first conductive unit disconnected electrically from the plurality of pixel electrodes and formed of a conductive material;
an opposite electrode formed to allow light to pass throughout, facing the pixel electrode;
an organic layer that is interposed between the plurality of pixel electrodes and the opposite electrode to emit light in the plurality of pixel regions; and
a second conductive unit formed of a conductive material, covering and connected electrically to the first conductive unit and the opposite electrode,
wherein the second conductive unit does not overlap the pixel electrodes.

11. The organic light-emitting display device of claim 10, wherein the first conductive unit is tapered inward from top to bottom.

12. The organic light-emitting display device of claim 10, wherein the first conductive unit is thicker than the opposite electrode.

13. The organic light-emitting display device of claim 10, wherein a pixel defining layer is formed on the passivation layer to cover edges of the each of pixel electrodes, the pixel defining layer comprising a first aperture adjacent to the plurality of pixel electrodes.

14. The organic light-emitting display device of claim 13, wherein the opposite electrode is formed in the first aperture.

15. The organic light-emitting display device of claim 13, wherein the opposite electrode is not formed in the first aperture.

16. The organic light-emitting display device of claim 10, wherein a plurality of the opposite electrodes are disposed to face the plurality of pixel electrodes, respectively.

17. The organic light-emitting display device of claim 10, wherein the opposite electrode is disposed to correspond to at least two adjacent pixel electrodes.

18. The organic light-emitting display device of claim 10, wherein the first conductive unit is formed on the passivation layer, the pixel defining layer comprises a second aperture for exposing at least one part of the first conductive unit, and the opposite electrode covers the second aperture.

19. The organic light-emitting display device of claim 10, further comprising a plurality of conductive lines connected electrically to the plurality of pixel circuit units, respectively, wherein at least one of the plurality of conductive lines of a pixel electrode is arranged to overlap with the pixel electrode.

20. The organic light-emitting display device of claim 10, wherein the passivation layer is formed of a transparent material.

21. The organic light-emitting display device of claim 10, wherein the first conductive unit is disposed between the substrate and the opposite electrode.

22. The organic light-emitting display device of claim 10, wherein a plurality of transparent insulating layers are disposed on a location corresponding to the transmitting region.

23. The organic light-emitting display device of claim 22, wherein at least one of the plurality of transparent insulating layers comprises an aperture on a location corresponding to at least one part of the transmitting region.

24. The organic light-emitting display device of claim 10, wherein the pixel electrode is a reflection electrode.

* * * * *